US009048273B2

(12) United States Patent
Oyama et al.

(10) Patent No.: US 9,048,273 B2
(45) Date of Patent: Jun. 2, 2015

(54) SUBSTRATE CONVEYING CONTAINER OPENING/CLOSING DEVICE, LID OPENING/CLOSING DEVICE AND SEMICONDUCTOR MANUFACTURING APPARATUS

(75) Inventors: Katsuhiko Oyama, Oshu (JP); Katsuyuki Hishiya, Oshu (JP); Yasushi Takeuchi, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 506 days.

(21) Appl. No.: 13/488,713

(22) Filed: Jun. 5, 2012

(65) Prior Publication Data

US 2012/0315114 A1 Dec. 13, 2012

(30) Foreign Application Priority Data

Jun. 7, 2011 (JP) .................................. 2011-127539

(51) Int. Cl.
*H01L 21/677* (2006.01)
(52) U.S. Cl.
CPC .................................. *H01L 21/67772* (2013.01)
(58) Field of Classification Search
CPC .................................................. H01L 21/67772
USPC ........................ 49/209, 210; 414/217.1, 411
See application file for complete search history.

(56) References Cited

U.S. PATENT DOCUMENTS

| 3,453,776 | A | * | 7/1969 | Weber et al. ..................... 49/209 |
| 4,432,164 | A | * | 2/1984 | Baguet ............................. 49/209 |
| 4,832,527 | A | * | 5/1989 | Bachmann ....................... 405/105 |
| 6,106,213 | A | * | 8/2000 | Denker ............................ 414/411 |
| 6,273,664 | B1 | * | 8/2001 | Doche ............................. 414/217 |
| 6,799,394 | B2 | * | 10/2004 | Tsung-Lin ....................... 49/209 |
| 6,869,263 | B2 | * | 3/2005 | Gilchrist ......................... 414/217 |
| 7,121,042 | B2 | * | 10/2006 | Robert et al. .................... 49/260 |
| 7,467,919 | B2 | * | 12/2008 | Weaver ........................... 414/815 |
| 7,789,609 | B2 | * | 9/2010 | Okabe et al. .................... 414/217 |
| 8,657,346 | B2 | * | 2/2014 | Okabe et al. .................... 292/144 |
| 8,870,516 | B2 | * | 10/2014 | Bonora .......................... 414/411 |

FOREIGN PATENT DOCUMENTS

| JP | 2004-342731 A | 12/2004 | |
| JP | 2005-026513 A | 1/2005 | |
| WO | WO 2005/004228 A1 * | 1/2005 | .............. H01L 21/68 |
| WO | WO 2013/005363 A1 * | 1/2013 | ............ H01L 21/677 |

* cited by examiner

*Primary Examiner* — James Keenan
(74) *Attorney, Agent, or Firm* — Nath, Goldberg & Meyer; Jerald L. Meyer

(57) ABSTRACT

A substrate conveying container opening/closing device includes an elevator carriage provided in a substrate transfer area and configured to be moved up and down by an elevator mechanism, a cover member for opening and closing an opening of a wall, a seal member for sealing a gap between the cover member and the periphery of the opening, a lid detaching/attaching mechanism provided in the cover member and configured to detach and attach the lid, a guide unit provided in the elevator carriage and configured to guide the cover member upward so that the cover member can advance from a retracting position toward the wall, a guideway provided in the wall to extend in a direction perpendicular to a seal surface of the opening, and a rotating body provided in the cover member and configured to roll downward along the guideway as the elevator carriage is moved downward.

8 Claims, 19 Drawing Sheets

FIG. 12
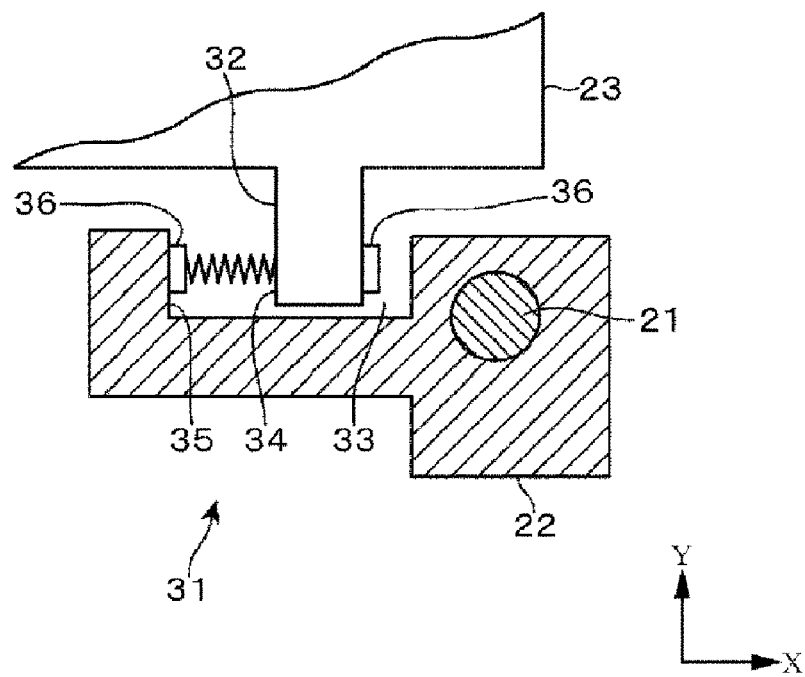
FIG. 13
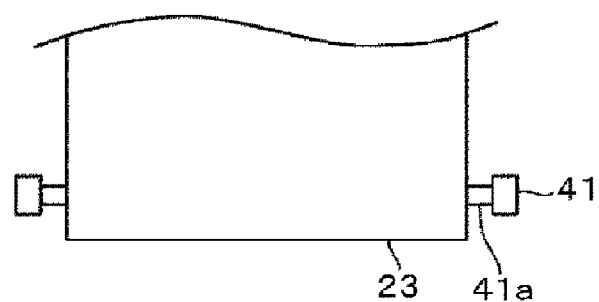
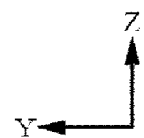

SUBSTRATE CONVEYING CONTAINER OPENING/CLOSING DEVICE, LID OPENING/CLOSING DEVICE AND SEMICONDUCTOR MANUFACTURING APPARATUS

CROSS-REFERENCE TO RELATED APPLICATION

This application claims the priority to Japanese Patent Application No. 2011-127539, filed on Jun. 7, 2011, in the Japan Patent Office, the disclosure of which is incorporated herein in their entirety by reference.

TECHNICAL FIELD

The present disclosure relates to an opening/closing device for opening and closing, e.g., a lid of a closed-type substrate conveying container and a semiconductor manufacturing apparatus provided with the opening/closing device.

BACKGROUND

In a semiconductor device manufacturing process, semiconductor wafers (hereinafter referred to as "wafers") as substrates are loaded into, e.g., a substrate conveying container called a closed-type FOUP (Front-Opening Unified Pod) in a shelf-like manner. Further, the wafers are transferred between semiconductor manufacturing apparatuses. Therefore, an opening/closing device for opening and closing a lid mounted on the side surface of a FOUP is provided in a wafer conveying port of a semiconductor manufacturing apparatus.

The opening/closing device is configured as follows. An opening is formed in a wall existing between a region in which the FOUP is placed and a wafer transfer region in which the wafers taken out from the FOUP are transferred. The periphery of the FOUP around the lid is brought into hermetic contact with the periphery of the opening of the opening. The opening is hermetically sealed by a cover member at the side of the wafer transfer region. The lid of the FOUP is removed by an opening/closing mechanism provided in the cover member. At this time, a seal member made of resin or rubber is installed between the cover member and the opening in order to, e.g., restrain an atmospheric gas existing in a FOUP transfer region from flowing into the wafer transfer region through a lid opening/closing region. When removing the lid of the FOUP, the region hermetically sealed by the seal member is initially evacuated and then supplied with a clean gas such as a nitrogen ($N_2$) gas or the like, thereby substituting the atmospheric gas existing in the hermetically sealed region with the clean gas. The cover member can move up and down between a lid detaching/attaching position and a shelter position in which the cover member waits when the wafers are taken out from the FOUP to the wafer transfer region. Moreover, the cover member can move back and forth between an up/down movement position and a position in which the cover member hermetically seals the opening.

In this regard, there is a demand for a technology capable of reducing the number of mechanisms provided in an opening/closing device, and consequently reducing the cost of the opening/closing device while restraining a generation of dust and particles from the mechanisms of the opening/closing device. More specifically, a demand is increased for developing a technology that omits a mechanism (particularly, a drive shaft) for advancing and retracting the opening/closing device. As one example of this technology, a device in which the surface sealed by an opening/closing device is inclined with respect to a vertical axis so that a transfer port can be sealed only by the up/down operation of the opening/closing device is provided.

However, if the surface sealed by the opening/closing device is inclined as stated above, the opening/closing device makes a sliding contact with a seal member. Thus, the seal member is easily worn out or unevenly worn out. It is therefore necessary to frequently perform maintenance services of the device (replacement of the seal member), which results in an increased maintenance cost.

SUMMARY

The present disclosure provides an opening/closing device for opening and closing a lid of a closed-type substrate conveying container, which is capable of simplifying a drive system and reducing wear of a seal member for hermetically sealing an opening at the side of a substrate transfer region.

According to one embodiment of the present disclosure, there is provided a substrate conveying container opening/closing device for bringing a periphery of a lid openably closing a front surface of a substrate conveying container into contact with a periphery of a first opening formed at a first surface side of a wall, and for removing the lid through a second opening formed to be inclined upward with respect to a vertical plane and formed on a substrate transfer area which is at a second surface side of the wall, the device comprising: an elevator carriage installed at the substrate transfer area, and configured to be moved up and down by an elevator mechanism; a cover member configured to open and close the second opening, to be supported by the elevator carriage, and to be provided with a peripheral edge portion making contact with a periphery of the second opening to close the second opening; a seal member configured to seal a gap between the cover member and the periphery of the second opening; a lid detaching/attaching mechanism installed at the cover member, and configured to detach and attach the lid of the substrate conveying container while the second opening is closed by the cover member; a guide unit installed at the elevator carriage, and configured to guide the cover member upward and to restrain a position of the cover member, in order for the cover member to advance from a retracting position toward the wall with respect to the elevator carriage; a guideway installed at the wall to extend in a direction perpendicular to a seal surface of the periphery of the second opening; and a rotating body installed at the cover member, and configured to be rotatable about a laterally-extending axis and parallel to an opening surface of the second opening, and configured to make contact with the guideway from above and to roll downward along the guideway as the elevator carriage is moved downward, the cover member configured to lie in a retracting position when the elevator carriage is in an upper position, configured to advance from the retracting position by a rolling movement of the rotating body and the guiding action of the guide unit as the elevator carriage is moved downward, and configured to close the second opening in a posture opposing the second opening.

According to another embodiment of the present disclosure, there is provided a substrate conveying container opening/closing device for bringing a periphery of a lid openably closing a front surface of a substrate conveying container into contact with a periphery of a first opening formed at a first surface side of a wall, and for removing the lid through a second opening formed to be inclined downward with respect to a vertical plane and formed on a substrate transfer area which is at a second surface side of the wall, the device comprising: an elevator carriage installed at the substrate transfer area, and configured to be moved up and down by an elevator mechanism; a cover member configured to open and close the second opening, to be supported by the elevator carriage, and to be provided with a peripheral edge portion making contact with a periphery of the second opening to close the second opening; a seal member configured to seal a gap between the cover member and the periphery of the second opening; a lid detaching/attaching mechanism installed at the cover member, and configured to detach and attach the lid of the substrate conveying container while the second opening is closed by the cover member; a guide unit installed at the elevator carriage, and configured to guide the cover member downward, and to restrain a position of the cover member, in order for the cover member to advance from a retracting position toward the wall with respect to the elevator carriage; a guideway installed at the wall to extend in a direction perpendicular to a seal surface of the periphery of the second opening; a rotating body installed at the cover member, configured to be rotatable about a laterally-extending axis and parallel to an opening surface of the second opening, and configured to make contact with the guideway from below and to roll upward along the guideway as the elevator carriage is moved upward; and the cover member configured to lie in a retracting position by a bias force of the biasing mechanism when the elevator carriage is in an lower position, configured to advance from the retracting position against the bias force of a biasing mechanism by a rolling movement of the rotating body and the guiding action of the guide unit as the elevator carriage is moved upward, and configured to close the second opening in a posture opposing the second opening, wherein the biasing mechanism biases the cover member toward the substrate transfer area with respect to the elevator carriage.

According to a further embodiment of the present disclosure, there is provided a lid opening/closing device for opening and closing, from a second surface side of an opening communicating a first surface side and the second surface side of a wall, a lid of a substrate transfer container installed at the first surface side or a lid hermetically closing the opening from the second surface side, the device comprising: a moving carriage installed at the second surface side of the wall, and configured to be moved by a moving mechanism between a first side and a second side of a shaft extending parallel along the wall; a seal surface formed in a periphery of the opening at the second surface side, and configured to be inclined toward the first side of the shaft with respect to a direction perpendicular to the wall; a cover member configured to open and close the opening, to be supported by the moving carriage, and to be provided with a peripheral edge portion making contact with the seal surface at the second surface side to close the opening; a seal member configured to seal a gap between the cover member and the seal surface; a lid detaching/attaching mechanism installed at the cover member, and configured to detach and attach the lid while the opening is closed by the cover member; a guide unit installed at the moving carriage, and configured to guide the cover member along a direction between a direction perpendicular to the wall and a direction toward the first side, and to restrain a position of the cover member, in order for the cover member to advance from a retracting position toward the wall with respect to the moving carriage; a guideway installed at the wall to extend in a direction perpendicular to the seal surface; a rotating body installed at the cover member, configured to be rotatable about an axis intersecting the shaft and parallel to the seal surface, and configured to make contact with the guideway and to roll along the guideway as the moving carriage is moved toward the first side; and the cover member configured to lie in a retracting position when the moving carriage is in the first side position, to advance from the retracting position by a rolling movement of the rotating body and the guiding action of the guide unit as the moving carriage is moved toward the first side, and to close the opening in a posture opposing the seal surface, wherein a biasing mechanism biases the cover member toward the substrate transfer area with respect to the elevator carriage.

According to a still further embodiment of the present disclosure, there is provided a semiconductor manufacturing apparatus, comprising: a support table configured to place a substrate conveying container; a processing unit configured to perform processing with respect to a substrate; a substrate transfer mechanism configured to deliver the substrate between the substrate conveying container placed on the support table and the processing unit; and said opening/closing device configured to open and close a lid of the substrate conveying container placed on the support table or a lid installed between the processing unit and the substrate transfer mechanism.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 12 is a horizontal sectional plan view showing the stopper mechanism.

FIG. 13 is a front view showing a portion of the opening/closing device.

DETAILED DESCRIPTION

Figure 1:
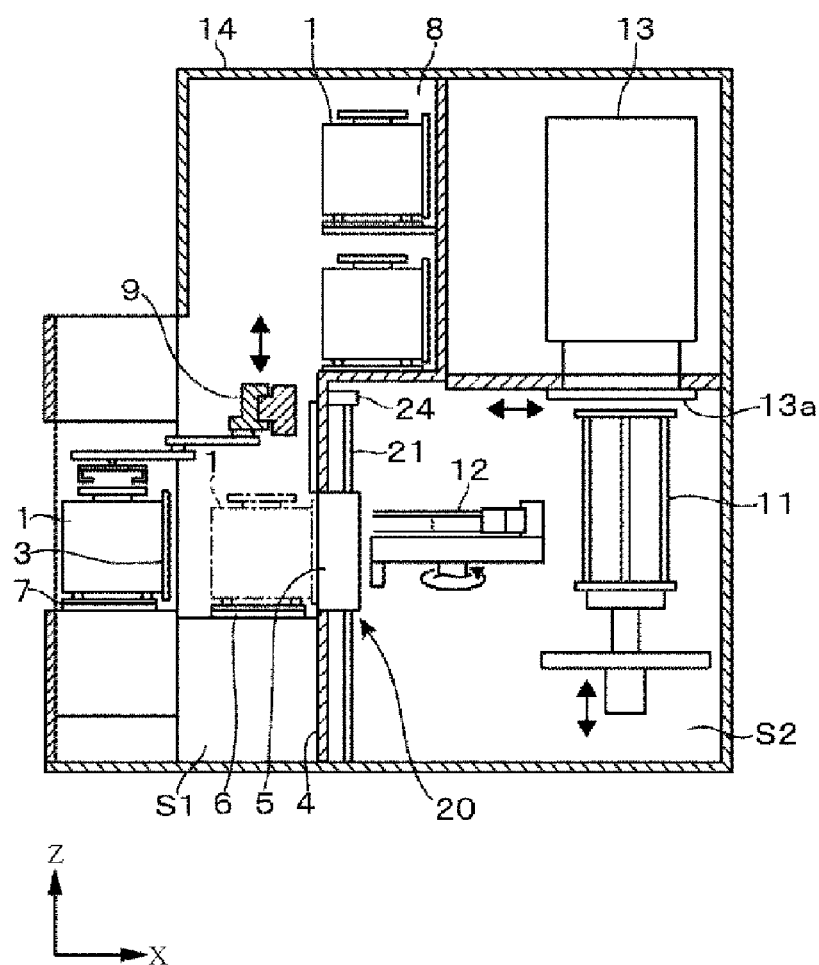
FIG. 1 is a vertical sectional view showing one example of a vertical heat treatment apparatus employing an opening/closing device according to the present disclosure.

Reference will now be made in detail to various embodiments, examples of which are illustrated in the accompanying drawings. In the following detailed description, numerous specific details are set forth in order to provide a thorough understanding of the inventive aspects of this disclosure. However, it will be apparent to one of ordinary skill in the art that the inventive aspects of this disclosure may be practiced without these specific details. In other instances, well-known methods, procedures, systems, and components have not been described in detail so as not to unnecessarily obscure aspects of the various embodiments.

An opening/closing device of a substrate conveying container according to one embodiment of the present disclosure will now be described with reference to FIGS. 1 to 15. The opening/closing device employs a vertical heat treatment apparatus as a semiconductor manufacturing apparatus. First, description will be made on the outline of an opening/closing device 20 and a vertical heat treatment apparatus. The opening/closing device 20 is a device for detaching and attaching (opening and closing) a lid 3 hermetically attached to a side (front) opening 2 of a FOUP 1, a closed-type substrate conveying container, which contains a plurality of, e.g., twenty five, wafers W in a shelf-like manner. The opening/closing device 20 is arranged between a conveying area S1 into which the FOUP 1 is conveyed from the outside of the vertical heat treatment apparatus and a loading area S2 in which the wafers W taken out from the FOUP 1 are transferred. Particularly, the opening/closing device 20 is arranged closer to the loading area S2 than a side wall 4 existing between the areas S1 and S2. A transfer the lid 3 and the wafers W are transferred through a transfer port 5 formed in the side wall 4. As will be set forth later, a seal member 56 for hermetically isolating an opening/closing area S3, in which the lid 3 is detached and attached, from the areas S1 and S2 is formed around the periphery of an opening of the transfer port 5 (a tubular body 5a), which may be placed at the same side as the loading area S2 so as to face obliquely upward. The opening/closing device 20 is configured to vertically move up and down along elevator rods 21 so that the opening/closing device 20 can move perpendicularly with respect to the seal member 56 and can make the hermetic contact with the seal member 56.

Figure 2:
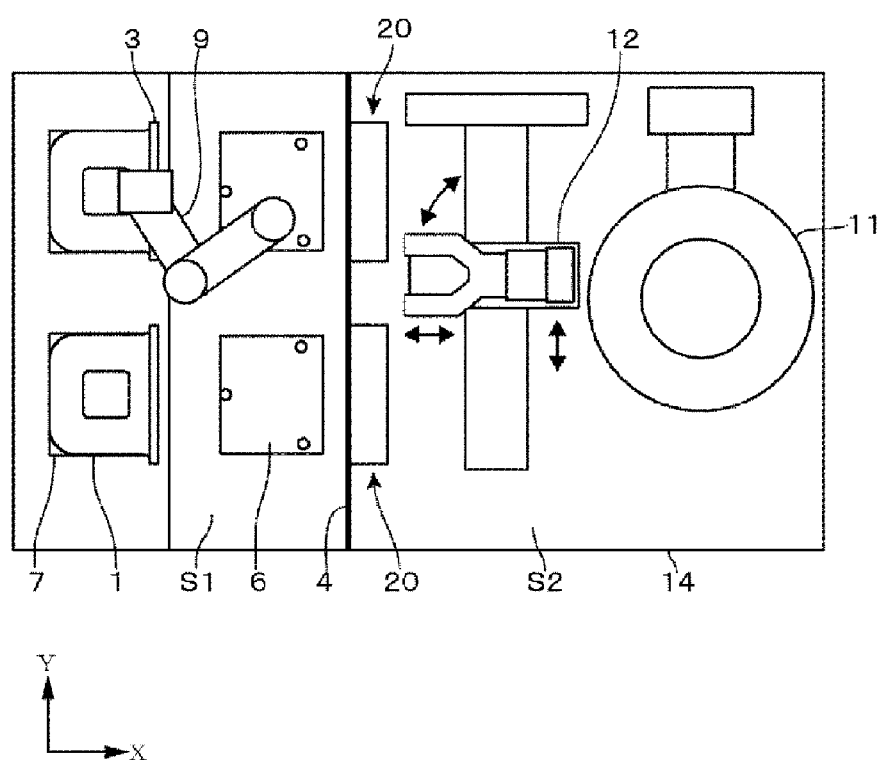
FIG. 2 is a horizontal sectional plan view showing the vertical heat treatment apparatus.
Figure 7:
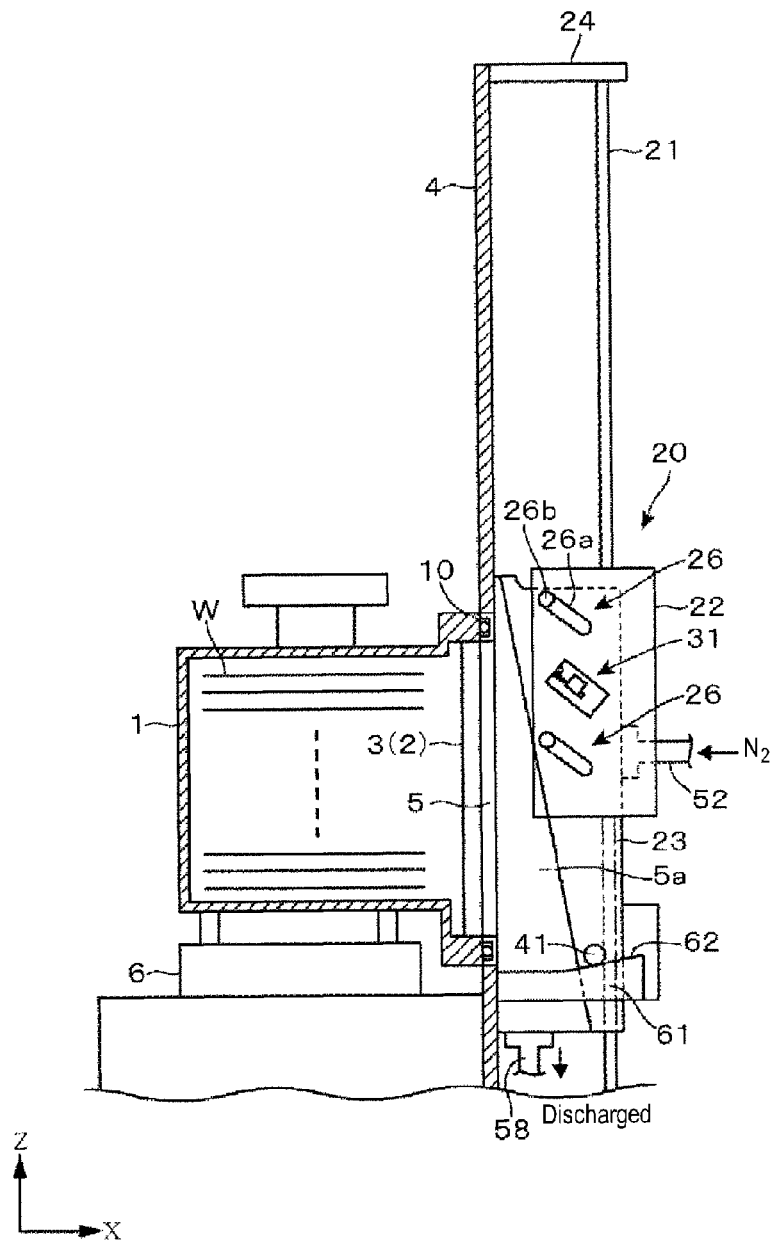
FIG. 7 is a side view showing the opening/closing device.
Figure 8:
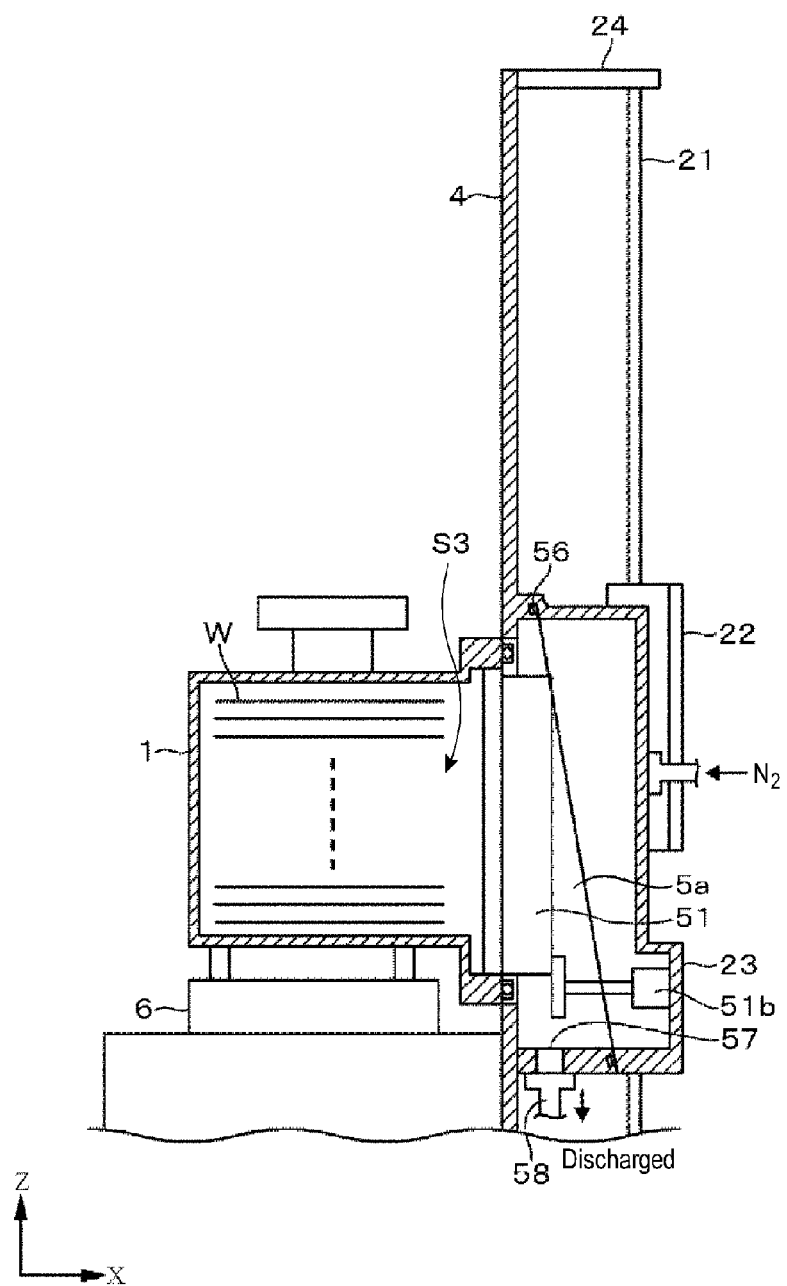
FIG. 8 is a vertical sectional view showing the opening/closing device.

Prior to describing the opening/closing device 20 in detail, the overview of the vertical heat treatment apparatus will be described briefly. As shown in FIGS. 1 and 2, for the hermetic contact between the periphery of the FOUP 1 around the lid 3 and the periphery of the opening of the transfer port 5 at one side of the side wall 4 (at the same side as the conveying area S1), support tables 6 for advancing and retracting the FOUP 1 in the front-rear direction (X-direction) in FIG. 1 are arranged at a plurality of, e.g., two points in the conveying area S1 spaced apart from each other along the left-right direction (Y-direction). As shown in FIG. 7, a sealing portion 10 made of, e.g., resin or rubber, is provided around the transfer port 5 at the side of the conveying area S1 to extend along the circumferential direction of the transfer port 5 so that the sealing portion 10 can make the hermetic contact with the periphery of the opening of the FOUP 1 pressed against the side wall 4. In FIG. 1, the FOUP 1 is placed on a conveyance stage 7 by a conveying mechanism existing outside the vertical heat treatment apparatus. A storage area 8 configured to store an empty FOUP 1 from which the wafers W are removed. A transfer arm 9 is configured to transfer the FOUP 1 between the support tables 6, the conveyance stage 7 and the storage area 8. The sealing portion 10 is shown in FIG. 7.

The loading area S2 is defined at an inner side of the conveying area S1 seen from the conveyance stage 7. The opening/closing devices 20 are provided in the loading area S2 so as to face the transfer ports 5, respectively. A wafer boat 11 for holding a plurality of, e.g., about one hundred, wafers W in a shelf-like manner is arranged at further inner side of the opening/closing devices 20. The wafer boat 11 can move up and down and can rotate about a vertical axis. A wafer transfer arm 12 as a substrate transfer mechanism for delivering the wafers W between the FOUP 1 existing in the conveying area S1 and the wafer boat 11 is provided between the opening/closing device 20 and the wafer boat 11. The wafer transfer arm 12 is capable of moving back and forth in the front-rear direction, rotating about a vertical axis, and moving in the left-right direction and in the up and down direction. A reaction tube 13 as a vertical treatment unit for hermetically storing the wafer boat 11 and performing, e.g., heat treatment, with respect to the wafers W is provided on top of the wafer boat 11. A cap opening/closing mechanism that horizontally holds a cap 13a for hermetically opening and closing a throat formed at the lower end of the reaction tube 13 is provided below the reaction tube 13. The cap opening/closing mechanism is configured to move toward and away from the reaction tube 13. In FIGS. 1 and 2, a housing 14 is provided between the inside and outside of the vertical heat treatment apparatus. A portion of a wall forming the housing 14 is arranged between the conveying area S1 and the loading area S2.

Figure 3:
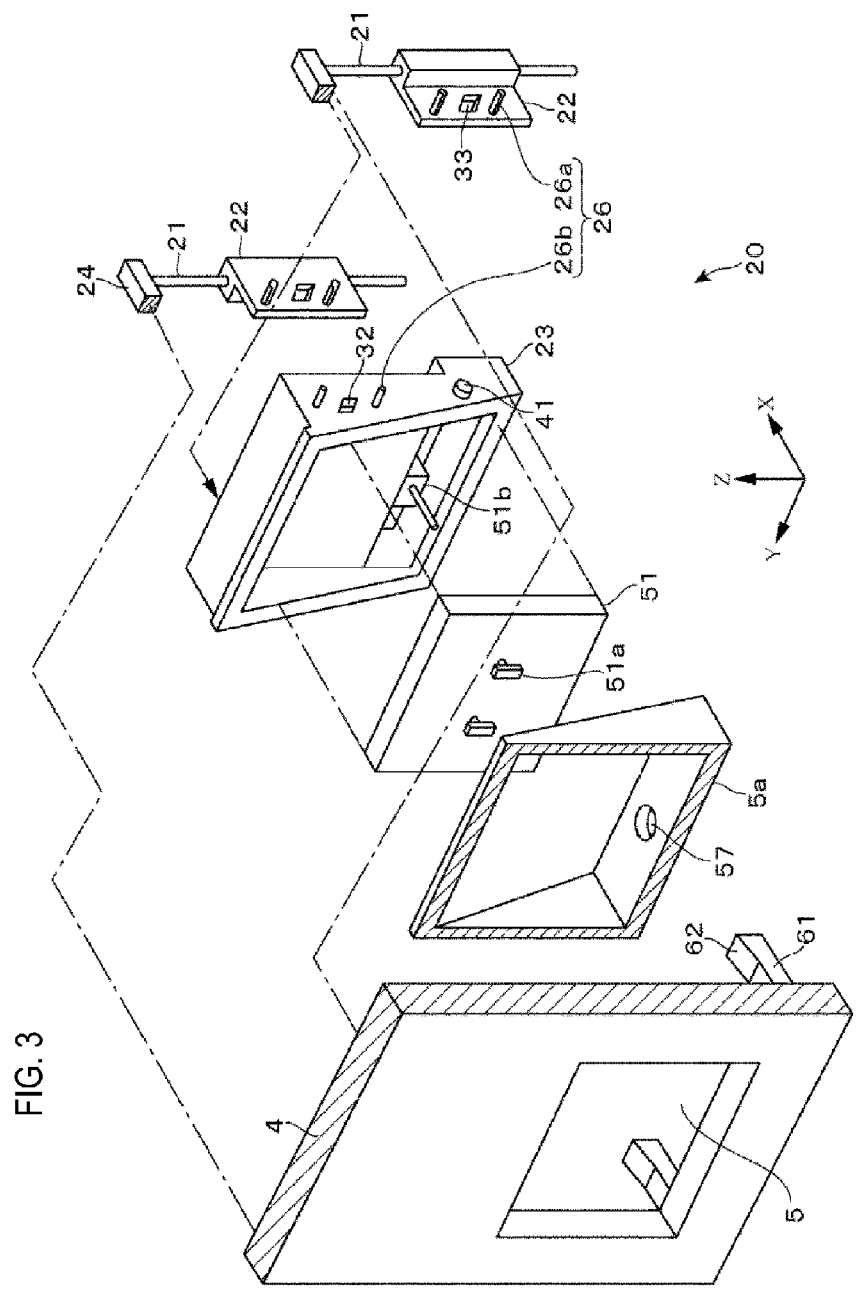
FIG. 3 is an exploded perspective view showing one example of the opening/closing device.
Figure 4:
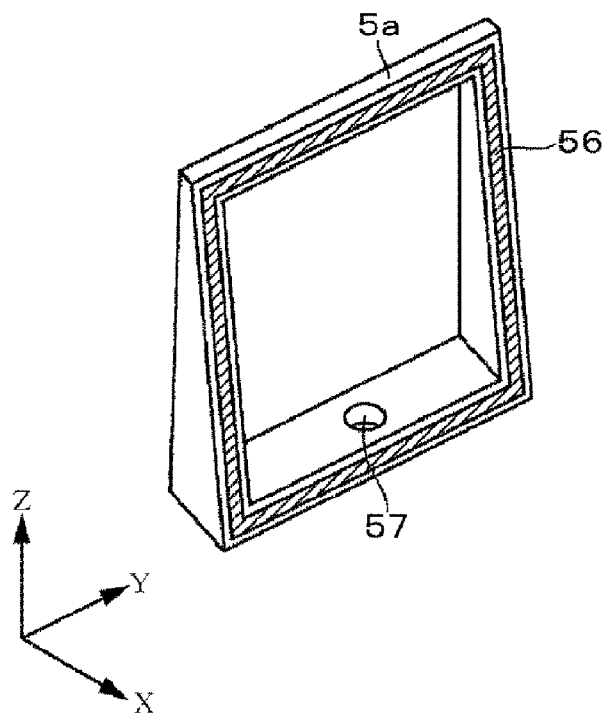
FIG. 4 is a perspective view of a transfer port, showing the region of the vertical heat treatment apparatus where a lid is detached and attached by the opening/closing device.
Figure 6:
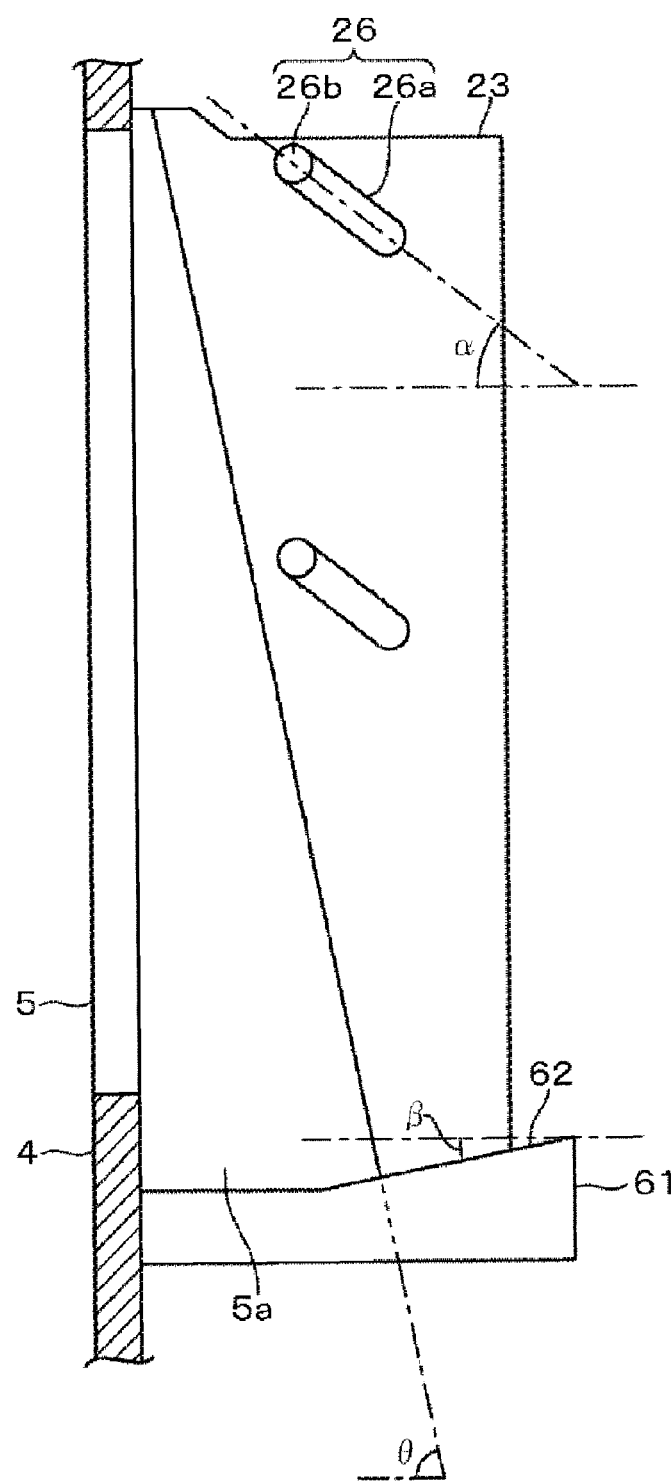
FIG. 6 is a schematic diagram schematically showing the opening/closing device.

In this regard, the surface defining the periphery of the opening of the transfer port 5 at the side of the loading area S2 is formed to face obliquely upward. In other words, as shown in FIGS. 3 and 4, a tubular body 5a having a substantially square tube shape is provided in the loading area S2. The tubular body 5a is formed to extend in the front-rear direction and is opened at one end and the other end thereof. At one end of the tubular body 5a, a peripheral edge portion extends horizontally toward the periphery of the opening of the transfer port 5 and makes the hermetic contact with the side wall 4. The surface formed at the other end of the tubular body 5a faces obliquely upward. If the opening of the transfer port 5 formed at the conveying area S1 and the opening of the transfer port 5 formed at the loading area S2 are respectively called a first opening and a second opening, the second opening is formed to extend obliquely upward with respect to the vertical plane. As shown in FIG. 6, the angle between the horizontal plane and the other end surface of the tubular body 5a is, e.g., 80 degrees. FIG. 6 schematically illustrates the opening/closing device 20.

Figure 5:
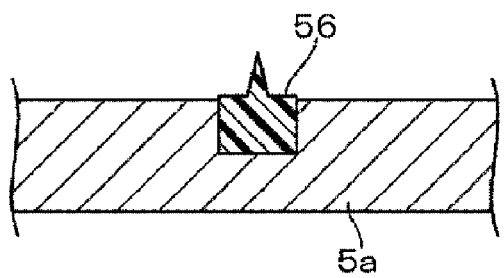
FIG. 5 is a sectional view showing a seal member sealed by the opening/closing device.

FIG. 3 depicts the tubular body 5a spaced apart from the side wall 4, and FIG. 4 schematically shows a seal member 56. The seal member 56 extending in the circumferential direction and made of, e.g., resin or rubber, is provided at the other end of the tubular body 5a in the loading area S2 so that the seal member 56 can surround the periphery of the opening of the tubular body 5a. In FIG. 4, for obtaining an increased elasticity (increased sealability), the seal member 56 is formed such that, when the seal member 56 is cut in the direction orthogonal to the longitudinal direction thereof as shown in FIG. 5, the central portion of the seal member 56 protrudes toward the wafer transfer arm 12. An exhaust hole 57 for discharging the atmospheric gas existing in the opening/closing area S3 is formed on the lower surface of the tubular body 5a. An exhaust path 58 extends from the exhaust hole 57 toward the lower side of the vertical heat treatment apparatus. An exhaust pump is connected to the exhaust path 58. The seal member 56 is omitted in FIG. 10.

Next, the opening/closing device 20 will be described in detail with reference to FIGS. 3 to 15. The opening/closing device 20 includes elevator rods 21, and elevator carriages (moving carriages) 22. The elevator rods 21 are configured to form parts of an elevator mechanism (moving mechanism) and to extend in the up-down direction. The elevator rods 21 are also arranged to be in parallel and spaced apart each other in the left-right direction along the side wall 4. Further, the elevator carriages (moving carriages) 22 have substantially plate-like shape and are configured to move along the elevator rods 21. A cover member 23 having a substantially box-like shape and opened toward the transfer port 5 is arranged between, and supported by, the elevator carriages 22 so that the cover member 23 can move up and down together with the elevator carriages 22 and can move back and forth in the front-rear direction with respect to the elevator carriages 22. In FIG. 7, the elevator rods 21 are partially omitted and indicated by a single-dot chain line in order to illustrate the opening/closing device 20.

Figure 9:
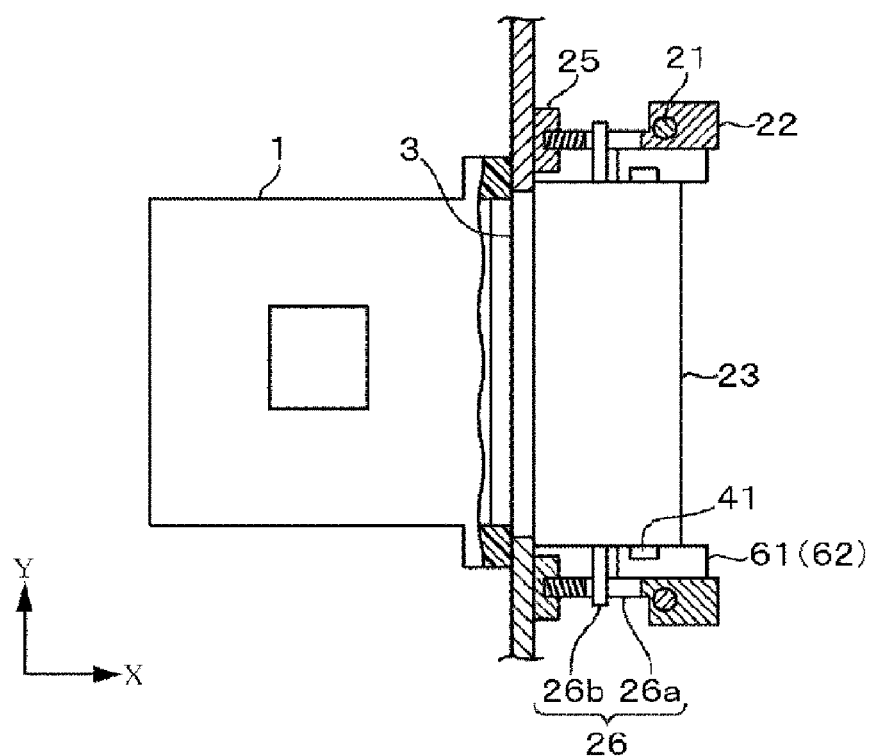
FIG. 9 is a horizontal sectional plan view showing the opening/closing device.
Figure 10:
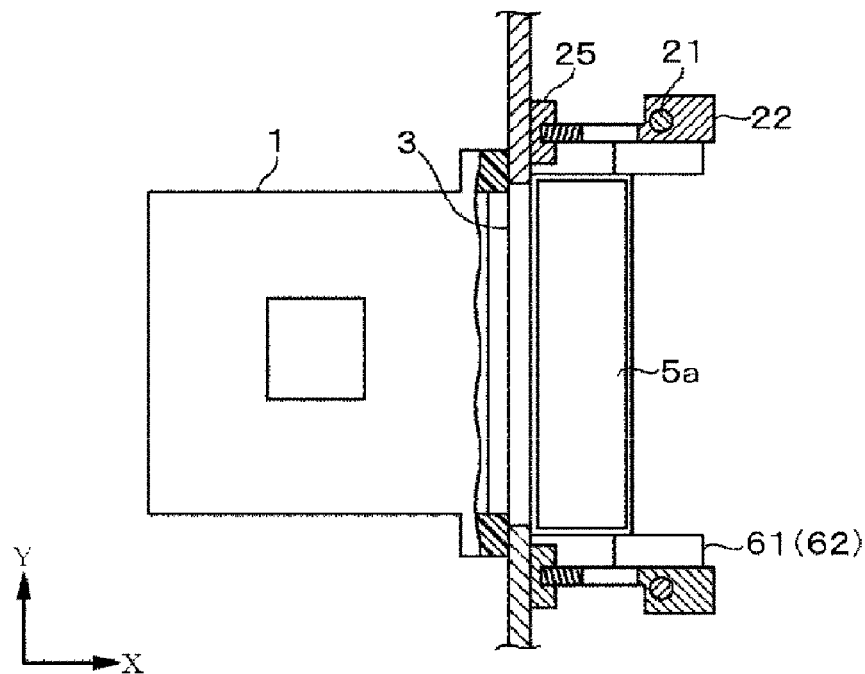
FIG. 10 is a horizontal sectional plan view showing the opening/closing device.

The upper ends of the elevator rods 21 are supported on the side wall 4 by support portions 24. The lower ends of the elevator rods 21 are fixed to a floor surface. Air cylinder mechanisms are provided, e.g., within the elevator rods 21 such that the elevator carriages 22 are supported by the air cylinder mechanisms so as to move up and down in parallel with each other. FIG. 9 depicts a state that the cover member 23 is attached to the opening/closing device 20. FIG. 10 illustrates a state that the cover member 23 is removed.

Each of the elevator carriages 22 is a substantially plate-like body formed to extend toward the side wall 4. Each of the elevator rods 22 is vertically inserted through one end portion of each of the elevator carriages 22 and the other portion at the side of the transfer port 5 is fitted to a guide groove 25 formed in the side wall 4 so that each of the elevator carriages 22 can be guided in the up-down direction. The elevator carriages 22 are moved up and down by the elevator rods 21 between a lower position in which the elevator carriages 22 face (oppose to) the transfer port 5 and a shelter position to which the elevator carriages 22 are moved so as not to interfere with the operation of taking out the wafers W from the FOUP 1 with the wafer transfer arm 12. The cover member 23 is interposed between, and supported by, the elevator carriages 22 at the lateral surface sides in the left-right direction thereof.

Guide units 26 are spaced apart from each other in the up-down direction. The guide units 26 are provided between the elevator carriages 22 and the cover member 23 to support the cover member 23 so that the cover member 23 can move back and forth in the front-rear direction with respect to the elevator carriages 22. More specifically, each of the guide units 26 includes through-holes 26a formed in each of the elevator carriages 22 extending, e.g., in the front-rear direction and rod-like advancing/retracting shafts 26b fixed at one end to the lateral wall surface of the cover member 23 facing the corresponding elevator carriage 22 and inserted at the other end into the through-holes 26a so that the cover member 23 can advance and retract as the advancing/retracting shafts 26b are moved along the through-holes 26a.

In this regard, the through-holes 26a are inclined to extend obliquely upward from the inner side toward the front side so that the cover member 23 can move upward with respect to the elevator carriages 22 as the cover member 23 is moved toward the transfer port 5 along the through-holes 26a. In other words, as will be described later, the cover member 23 moves obliquely downward toward the open end of the tubular body 5a when the cover member 23 is moved away from the wafer transfer arm 12 toward to the transfer port 5. When seen from the elevator carriages 22, the cover member 23 moving obliquely downward is moved vertically downward more slowly than the elevator carriages 22. It is therefore can be said that the cover member 23 is moved upward with respect to the elevator carriages 22. Accordingly, the orientation of the through-holes 26a is set in conformity with the relative movement direction of the cover member 23 with respect to the elevator carriages 22. By obliquely forming the through-holes 26a in this manner, the cover member 23 is positioned at the lower side (at the side of the wafer transfer arm 12) along the through-holes 26a under the influence of the gravity, when the lower end portion of the cover member 23 is not supported by other portions (the guide portion 61 to be described later) when the elevator carriages 22 are moved up toward the advancing/retracting position.

The guide units 26 are provided at two points along the up-down direction. Therefore, when moving in the front-rear direction, the cover member 23 is guided by the guide units 26 and is kept in a posture facing the opening surface of the tubular body 5a (the cover member 23 does not fall toward the transfer port 5 or the wafer transfer arm 12). As shown in FIG. 6, an angle α between the extension direction of the through-holes 26a and the horizontal plane may be 10 degrees.

Figure 14:
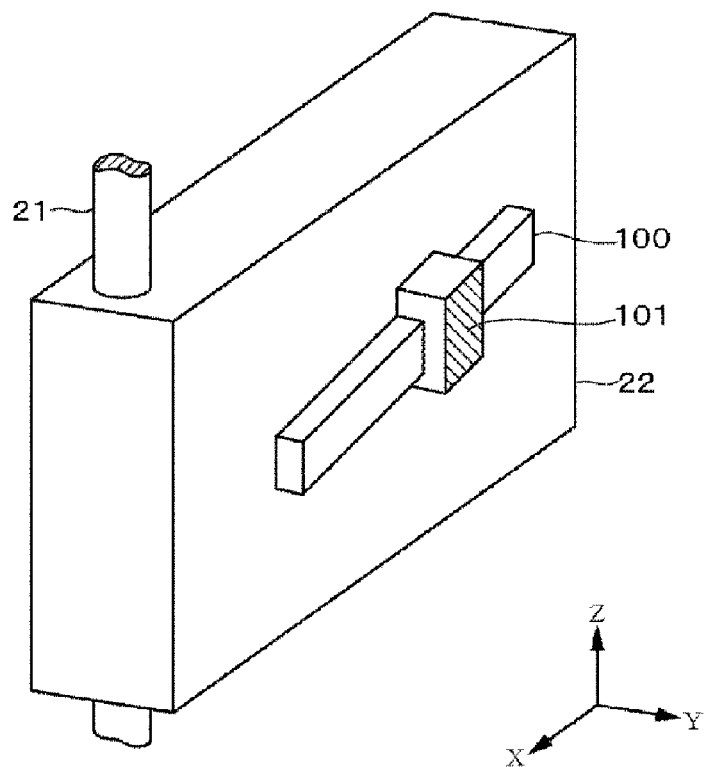
FIG. 14 is a perspective view showing a guide portion of the opening/closing device for guiding a door member.
Figure 15:
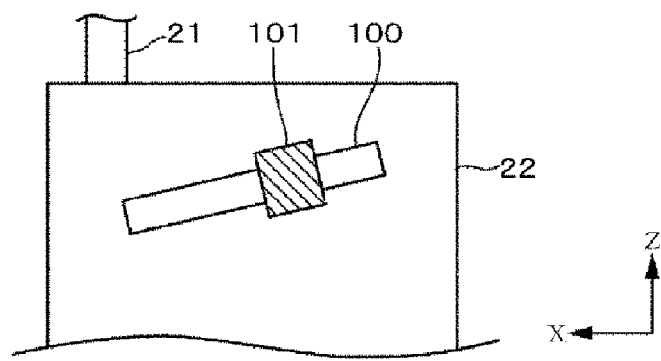
FIG. 15 is a side view showing the guide portion.

As described above, guide units 26 include the through-holes 26a and the advancing/retracting shafts 26b. On the other hand, as shown in FIGS. 14 and 15, in place of each of the through-holes 26a and each of the advancing/retracting shafts 26b, a guide rail 100 may be provided in the elevator carriages 22, and an advancing/retracting portion 101 may be provided in the cover member 23 to be advanced and retracted under the guidance of the guide rail 100. In FIGS. 14 and 15, only one guide unit 26 is depicted and the opening/closing device 20 is partially shown.

Biasing mechanisms 31 formed of, for example, springs are provided between the elevator carriages 22 and the cover member 23 to bias the cover member 23 toward the wafer transfer arm 12 with respect to the elevator carriages 22. More specifically, a protrusion 32 protruding in a substantially rectangular shape toward each of the elevator carriages 22 between the guide units 26 and 26 is provided on the surface of the cover member 23 facing each of the elevator carriages 22. An opening 33, to which the protrusion 32 is loosely fitted (fitted with a gap region), is formed in each of the elevator carriages 22.

Figure 11:
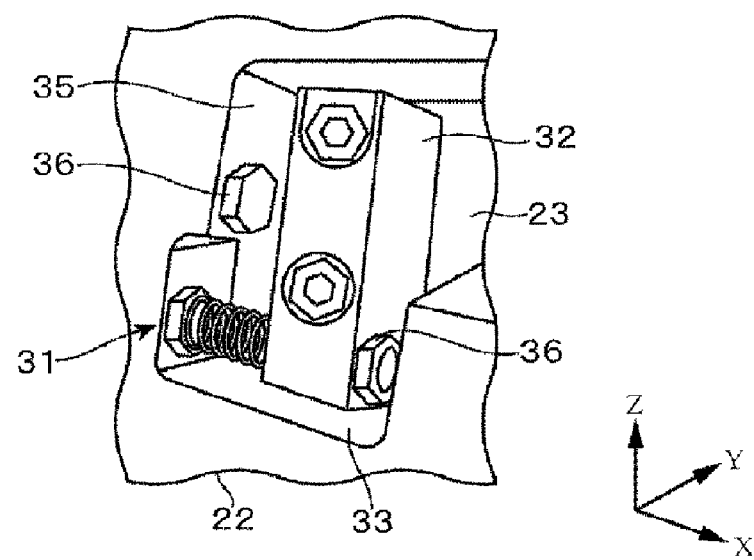
FIG. 11 is a perspective view showing a stopper mechanism provided in the opening/closing device.

As shown in FIGS. 11 and 12, the biasing mechanism 31 is provided between the side surface of the protrusion 32 existing at the side of the transfer port 5 and the inner wall surface of the opening 33 facing said side surface. One end of the biasing mechanism 31 is fixed to said side surface and the other end of the biasing mechanism 31 is fixed to the inner wall surface. The biasing mechanism 31 is configured to assist the movement of the cover member 23 when the cover member 23 is moved downward (toward the wafer transfer arm 12) along the through-holes 26a by the gravity. The extension and contraction direction of the biasing mechanism 31 conforms to the longitudinal direction of each of the through-holes 26a. At this time, the opening 33 is formed along the longitudinal direction of each of the through-holes 26a so as not to hinder the extension and contraction operation of the biasing mechanism 31. The surfaces of the opening 33 and the protrusion 32, to which the biasing mechanism 31 is fixed, are orthogonal to the extension and contraction direction of the biasing mechanism 31. The biasing mechanism 31 is omitted in FIG. 3.

The surface of the cover member 23 and the surface of the elevator carriages 22, to which the biasing mechanism 31 is fixed, are respectively called a first support surface 34 and a second support surface 35. An elastic body as a stopper mechanism 36 made of, e.g., resin, is provided on the second support surface 35, and configured to be spaced apart from the first support surface 34 to prevent a collision between each of the elevator carriages 22 and the cover member 23. Similarly, a stopper mechanism 36 for preventing a collision between each of the elevator carriages 22 and the cover member 23 is provided on the opposite surface of the protrusion 32 from the first support surface 34.

Next, the cover member 23 will be described in detail. As stated above, the cover member 23 is formed into a substantially box-like shape and opened toward the transfer port 5. The lower end portion of the cover member 23 extends downward beyond the lower edge of each of the elevator carriages 22. Rotating bodies 41 rotatable about a horizontal axis parallel to the side wall 4 are provided on the side surfaces of the cover member 23 below each of the guide units 26. In other words, as shown in FIG. 13, one end of a shaft portion 41a extending along the horizontal axis is fixed to the cover member 23. The rotating body 41 is rotatably attached to the other end of the shaft portion 41a. The rotating bodies 41 are provided at the left and right sides of the cover member 23. The shaft portion 41a is omitted in figures except FIG. 13.

The peripheral edge portion of the cover member 23 facing the transfer port 5 is formed so that the surface of the peripheral edge portion can face obliquely downward to make the hermetic contact with the periphery of the opening of the tubular body 5a. A lid detaching/attaching mechanism 51 having a substantially box-like shape is provided at the side of the cover member 23 facing the transfer port 5. The lid detaching/attaching mechanism 51 can be extended into the conveying area S1 through the transfer port 5 for detaching and attaching (opening and closing) the lid 3 of the FOUP 1. One end of a gas supply pipe 52 is connected to the side surface of the cover member 23 facing the wafer transfer arm 12 to supply a clean gas, e.g., a nitrogen gas, to the opening/closing area S3 when substituting the atmospheric gas existing in the opening/closing area S3. In FIG. 3, an unlocking member 51a is provided in the lid detaching/attaching mechanism 51. The unlocking member 51a is inserted into a key hole formed on the outer surface of the lid 3, thereby unlocking the lid 3. The operation of the unlocking member 51a, which detaches and attaches the lid 3, is performed by a drive unit provided within the lid detaching/attaching mechanism 51. In FIG. 3, a drive mechanism 51b is further provided for advancing and retracting the lid detaching/attaching mechanism 51.

As shown in FIG. 3, guide portions 61 extending perpendicular from the side wall 4 toward the positions below the rotating bodies 41 are provided in the side wall 4 at the side of the loading area S2 to interpose the tubular body 5a therebetween in the left-right direction. The upper surfaces of the guide portions 61 are formed to extend obliquely downward from the inner side toward the front side so that the guide portions 61 can guide the rotating bodies 41 toward the transfer port 5 in the area below the rotating bodies 41 (the area where the cover member 23 moves in the front-rear direction). As shown in FIG. 6, an angle β between the guideway 62 and the horizontal plane may be 10 degrees, so that the guideway 62 can be orthogonal to the opening surface of the tubular body 5a. More particularly, the angle β is set for the guideway 62 to make an angle of 90±5 degrees with respect to the opening surface of the tubular body 5a. The upper slant surface of each of the guide portions 61 forms the guideway 62.

The vertical heat treatment apparatus is provided with a control unit including a computer for controlling the operation of the apparatus as a whole. The control unit includes a memory that stores a program used in taking out the wafers W from the FOUP 1 conveyed into the vertical heat treatment apparatus from the outside and performing heat treatment with respect to the wafers W loaded into the wafer boat 11 within the reaction tube 13. The program is installed into the control unit from a storage unit, e.g., a storage medium such as a hard disk, a compact disk, a magneto-optical disk, a memory card or a flexible disk.

Figure 16:
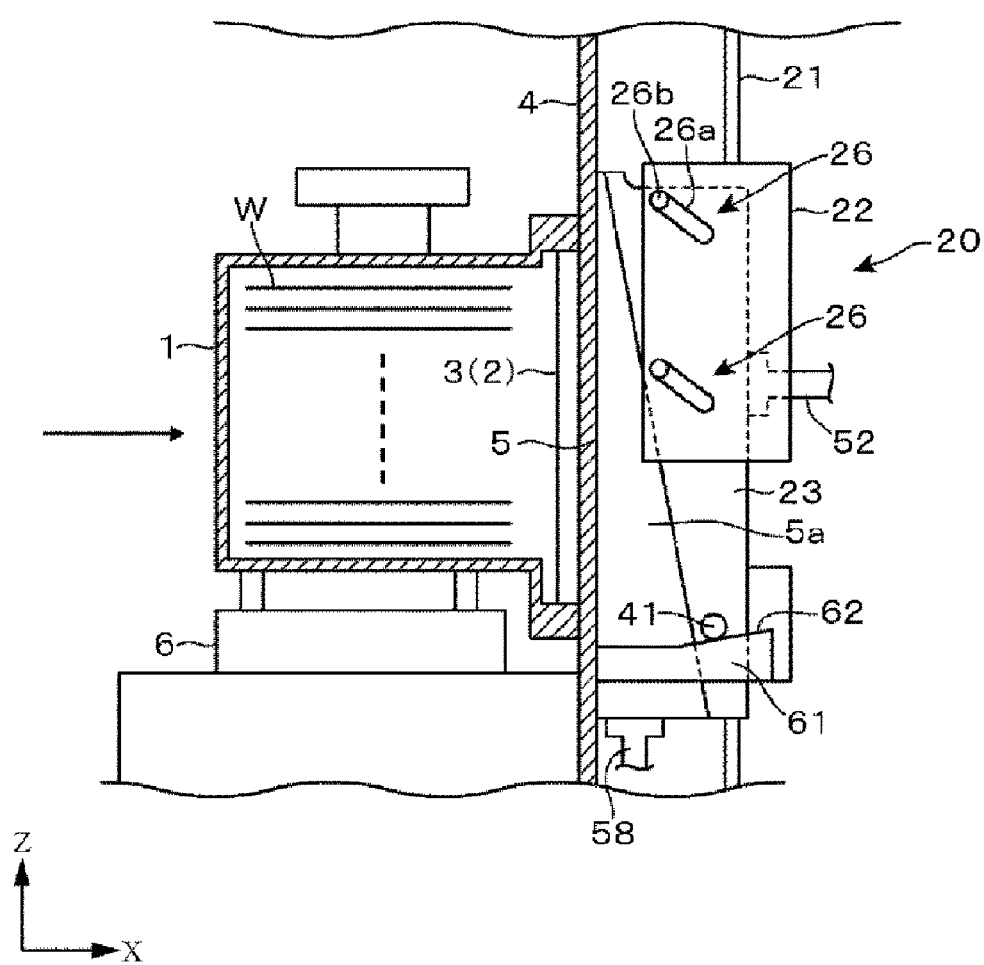
FIG. 16 is an operational view illustrating the operation of the opening/closing device.

Next, description will be made on the operation of the embodiment described above. First, the FOUP 1 conveyed to the conveyance stage 7 by a conveying mechanism existing outside the vertical heat treatment apparatus is moved onto the support tables 6 by the transfer arm 9. To prevent the atmospheric gas existing in the conveying area S1 from flowing into the loading area S2 at this time, the cover member 23 is positioned to hermetically seal the opening of the tubular body 5a at the side of the loading area S2. The rotating bodies 41 are positioned on the guide portions 61. Then, as shown in FIG. 16, the support tables 6 is moved toward the inner side to bring the side of the lid 3 of FOUP 1 (the periphery of the opening 2) into hermetic contact with the side of the loading area S2. Thus the opening/closing area S3 where the lid 3 positioned is hermetically isolated from the conveying area S1 and the loading area S2.

Subsequently, the atmospheric gas existing within the opening/closing area S3 is discharged through the exhaust path 58 and a clean gas is supplied from the gas supply pipe 52 to the opening/closing area S3, thereby substituting the existing atmospheric gas in the opening/closing area S3 with the clean gas. Accordingly, the atmospheric gas in the side of the FOUP 1 (at the side of the conveying area S1) is discharged through the opening/closing area S3. Since the gap between the tubular body 5a and the cover member 23 is hermetically sealed by the seal member 56, the clean gas or the atmospheric gas in the conveying area S1 does not flow into the loading area S2.

Figure 17:
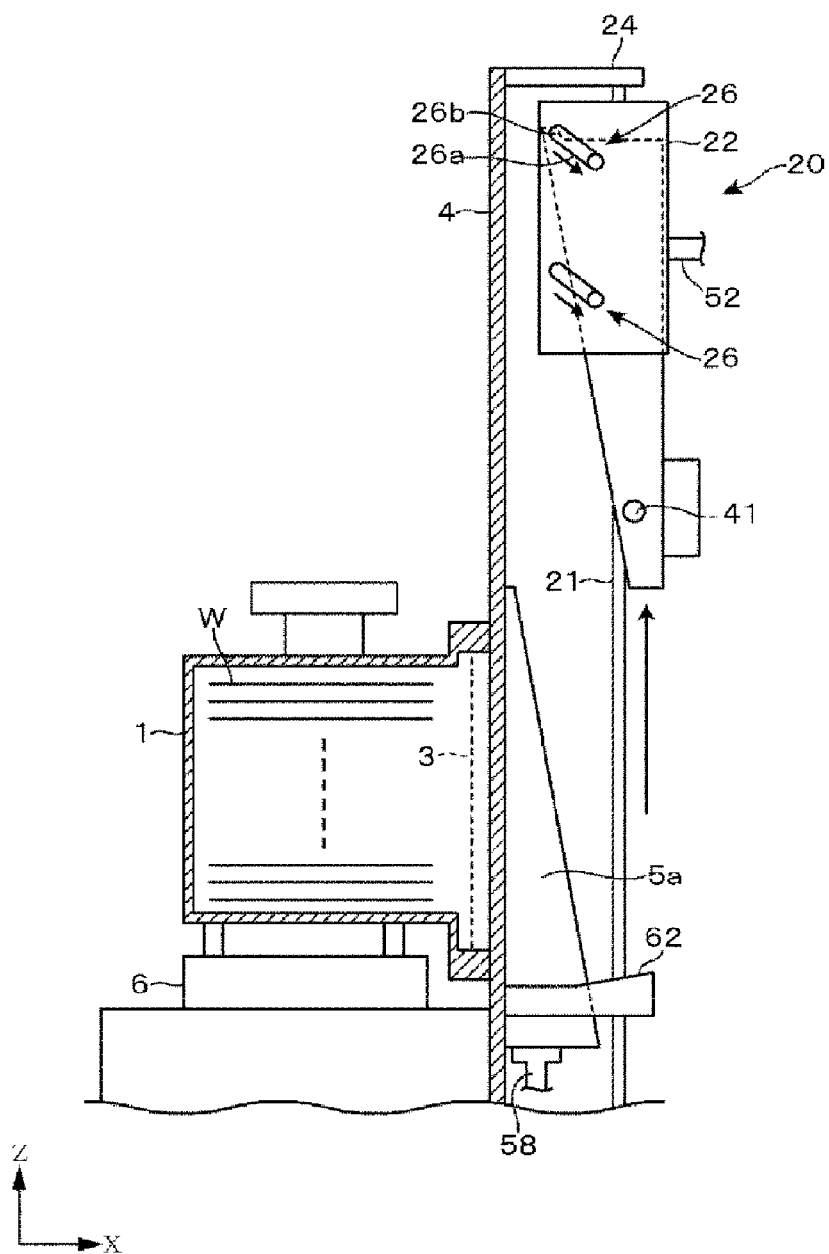
FIG. 17 is an operational view illustrating the operation of the opening/closing device.

Then, the lid detaching/attaching mechanism 51 installed in the cover member 23 is extended toward the FOUP 1 through the internal area of the tubular body 5a and the transfer port 5. The lid 3 is removed from the FOUP 1 using the unlocking member 51a. Thereafter, the lid detaching/attaching mechanism 51 is returned, together with the lid 3, to the original position at the side of the cover member 23. Then, as shown in FIG. 17, the elevator carriages 22, the cover member 23, the lid detaching/attaching mechanism 51 and the lid 3 are moved to the upper shelter position so as not to interfere with the operation of taking out the wafers W from the FOUP 1 with the wafer transfer arm 12. At this time, if the elevator carriages 22 are moved upward, the rotating bodies 41 move away from the guide portions 61. As set forth above, the guide unit 26 is inclined downward from the transfer port 5 toward the wafer transfer arm 12. The cover member 23 is biased toward the wafer transfer arm 12 by the biasing mechanism 31. Therefore, when in the shelter position, the cover member 23 is positioned in the area (the retracted position) spaced apart from the transfer port 5 toward the wafer transfer arm 12. The lid 3 is omitted in FIG. 17.

Subsequently, the wafer transfer arm 12 extends toward the FOUP 1. The wafer transfer arm 12 transfers, e.g., all the wafers W from the FOUP 1 to the wafer boat 11 by repeating, a number of times, the operation of taking out the wafers W through the tubular body 5a and the transfer port 5 and the operation of loading the wafers W into the wafer boat 11. If the FOUP 1 becomes empty, the lid 3 is closed (attached) in the following manner.

Figure 18:
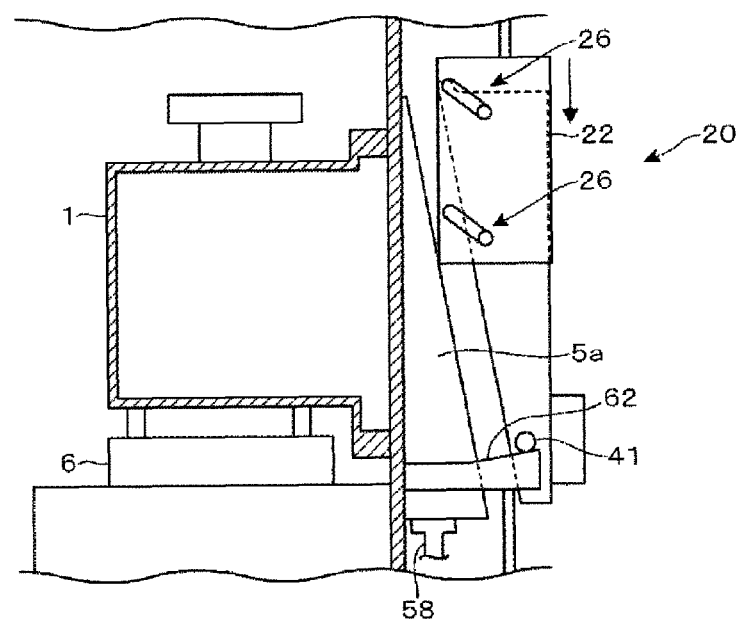
FIG. 18 is an operational view illustrating the operation of the opening/closing device.
Figure 19:
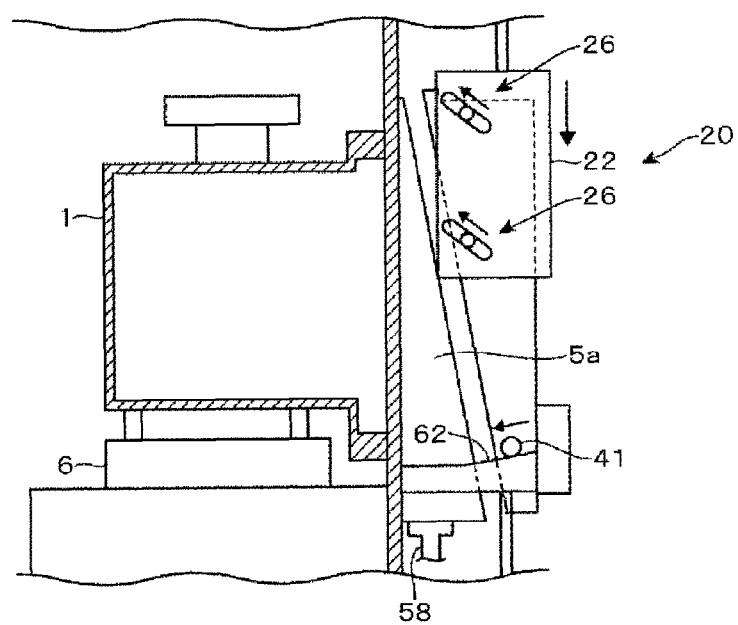
FIG. 19 is an operational view illustrating the operation of the opening/closing device.

The elevator carriages 22 and the cover member 23 are moved down from the shelter position toward the lower position. During the downward movement of the elevator carriages 22, the rotating bodies 41 make a contact with the guide portions 61 as shown in FIG. 18. The vertical downward movement of the rotating bodies 41 is restrained by the guide portions 61. Therefore, if the elevator carriages 22 attempt to make further downward movement, the rotating bodies 41 roll downward along the guideway 62 of the guide portions 61, thereby causing the cover member 23 to perpendicularly move toward the opening surface of the tubular body 5a. At this time, the posture of the cover member 23 with respect to the vertical plane is restrained by the guide units 26. Therefore, as shown in FIG. 19, the cover member 23 moves forward while keeping the surface of the cover member 23 facing the transfer port 5 parallel to the opening surface of the tubular body 5a. Thereafter, the cover member 23 makes hermetic contact with the opening surface of the tubular body 5a through the seal member 56 as shown in FIG. 16. Then, the lid detaching/attaching mechanism 51 holding the lid 3 is extended toward the FOUP 1 through the tubular body 5a and the transfer port 5 to attach the lid 3 to the FOUP 1. The elevator rods 21 are partially omitted in FIGS. 16 to 19.

Figure 20:
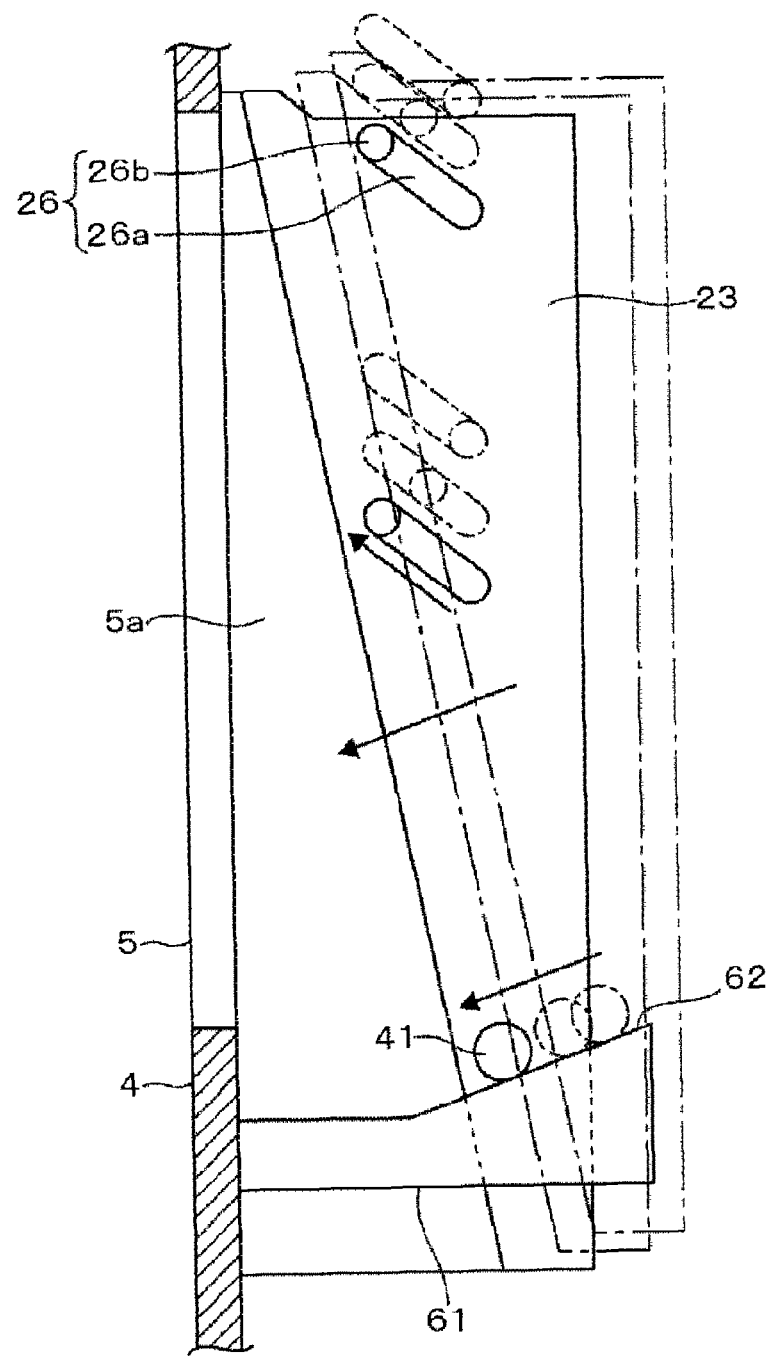
FIG. 20 is a schematic view schematically illustrating the operation of the opening/closing device.

FIG. 20 schematically shows how the cover member 23 moves toward the tubular body 5a. It can be noted in FIG. 20 that, when the rotating bodies 41 are moved downward (toward the transfer port 5) along the guideway 62, the advancing/retracting shafts 26b of the guide units 26 move obliquely upward within the through-holes 26a. In FIG. 20, the edge lines of the cover member 23, each of the guide units 26 and the rotating bodies 41 in different positions before the cover member 23 makes hermetic contact with the tubular body 5a are indicated by single-dot chain lines.

The empty FOUP 1, to which the lid 3 is attached in this manner, is conveyed to the storage region 8. Thereafter, the lid 3 is detached, the wafers W are taken out, and then, the lid 3 are attached with respect to another FOUP 1 containing unprocessed wafers W. After the wafers W are taken out from a plurality of FOUPs 1 one after another, the wafer boat 11 holding, e.g., about 150 wafers W, is hermetically put into the reaction tube 13. The wafers W are subjected to heat treatment, e.g., film formation treatment. Thereafter, the wafers W are transferred back to the original FOUP 1 in the opposite order to the order in which the wafers W are taken out from the FOUP 1.

As described above, when removing the lid 3 of the FOUP 1 through the transfer port 5 formed in the side wall 4, the tubular body 5a is brought into the hermetic contact with the side wall 4 so that the periphery of the opening of the transfer port 5 can face obliquely upward at the side of the loading area S2. The elevator carriages 22 are configured to move up and down together with the cover member 23. The cover member 23 is provided with the rotating bodies 41. The guide portions 61 are provided to guide the rotating bodies 41 in such a way that, when the elevator carriages 22 move downward, the cover member 23 can move perpendicularly with respect to the opening surface of the tubular body 5a. In order to restrain the posture of the cover member 23 when moving the cover member 23 toward the tubular body 5a, the guide units 26 are provided between the cover member 23 and the elevator carriages 22. Accordingly, the cover member 23 is moved up and down and is moved perpendicularly with respect to the seal member 56 only by the up/down operation of the elevator carriages 22. This restrains the cover member 23 from sliding with respect to the seal member 56. It is therefore possible to reduce wear (degradation) of the seal member 56. In this regard, an opening/closing device 20 was fabricated using a test unit. An accelerated test on the wear resistance of the seal member 56 was conducted. The test reveals that the wear of the seal member 56 was not observed even after the operation of the opening/closing device 20 corresponding to that of ten years.

Since the cover member 23 is brought into the hermetic contact with the seal member 56 by the up/down operation of the elevator carriages 22, there is no need to employ a mechanism (drive shaft) for moving the cover member 23 in the front-rear direction. Therefore, as compared with a case where the drive shaft is employed, it becomes possible to simplify the drive system and to reduce the cost of the device. In addition, the provision of the stopper mechanisms 36 and 36 makes it possible to restrain collision between the cover member 23 and the elevator carriages 22.

The angle α between each of the guide units 26, and the horizontal plane may be represented by an inequality 0 degrees $<\alpha<90$ degrees and may be set so as not to hinder the movement of the cover member 23 guided by the guide portions 61. If the angle α is too large (closer to 90 degrees), the movement stroke of the elevator carriages 22 required for the cover member 23 to reach the seal member 56 becomes longer. It is therefore preferred that the angle α be set as small as possible (closer to 0 degrees). As stated above, the cover member 23 is moved perpendicularly with respect to the seal member 56. In this regard, the perpendicularity may be in such a level as to reduce the wear of the seal member 56, more particularly 90±5 degrees. While two sets of the rotating bodies 41 and the guide portions 61 are provided at the left and right sides of the cover member 23, one set of the rotating body and the guide portion may be arranged only at one side of the cover member 23 or in the position below the tubular body 5a. While two sets of the elevator rods 21 and the elevator carriages 22 are provided at the left and right sides of the cover member 23, one set of the elevator rod 21 and the elevator carriage 22 may be arranged only at one side of the cover member 23, thereby providing a mechanism that moves the cover member 23 up and down in a cantilevered manner.

Figure 21:
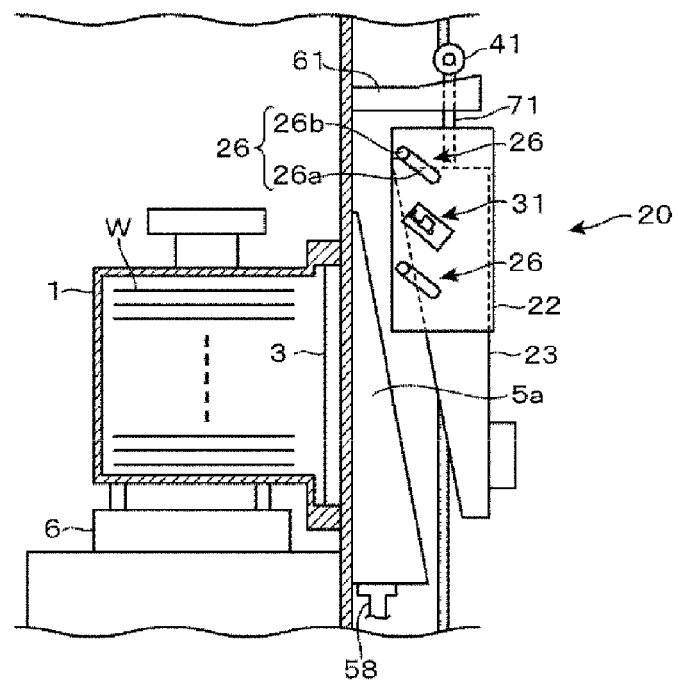
FIG. 21 is a side view showing another example of the opening/closing device.

Description will now be made on other embodiments of the opening/closing device 20. FIG. 21 shows an example in which the rotating bodies 41 and the guide portion 61 are arranged above the cover member 23 and not below the cover member 23. More specifically, the lower end of a support shaft 71 extending in the up-down direction is connected to the upper surface of the cover member 23. In order to detour the up/down movement area of the cover member 23, the upper end portion of the support shaft 71 is bent outward as it extends upward when the transfer port 5 is seen at the side of the wafer transfer arm 12. The upper end portion of the support shaft 71 is connected to the rotating body 41 (more particularly, the shaft portion 41a). The guide portion 61 is provided above the cover member 23 in the position outside the up/down movement area of the cover member 23 so that the guide portion 61 can guide the lower surface of the rotating body 41.

Figure 22:
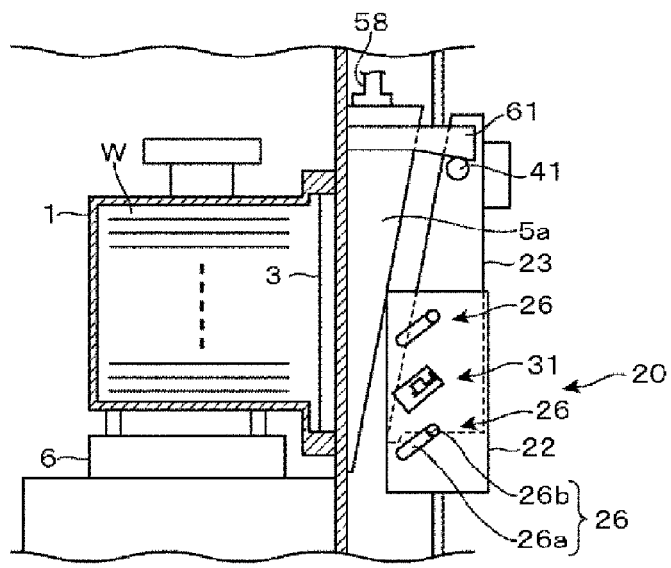
FIG. 22 is a side view showing another example of the opening/closing device.

FIG. 22 illustrates a shelter position provided below the tubular body 5a according to an embodiment of the present disclosure. In FIG. 22, the opening/closing device 20 is formed by vertically inverting the opening/closing device 20 shown in FIG. 3. More specifically, the tubular body 5a is formed to face obliquely downward. The guide portion 61 is arranged so that the guideway 62 can face downward and can lie above the cover member 23. The guideway 62 is formed to extend obliquely downward from the front side toward the inner side. The guide unit 26 is formed to extend obliquely upward from the front side toward the inner side.

In FIG. 22, when in the shelter position, the cover member 23 is biased toward wafer transfer arm 12 (toward the back side of the through-hole 26a) by the biasing force of the biasing mechanism 31. If the elevator carriage 22 moves upward and if the rotating body 41 makes a contact with the guideway 62, the rotating body 41 is moved upward against the biasing force of the biasing mechanism 31 while moving toward the tubular body 5a along the guideway 62. The cover member 23 is moved downward with respect to the elevator carriage 22. The cover member 23 perpendicularly faces the seal member 56.

Figure 23:
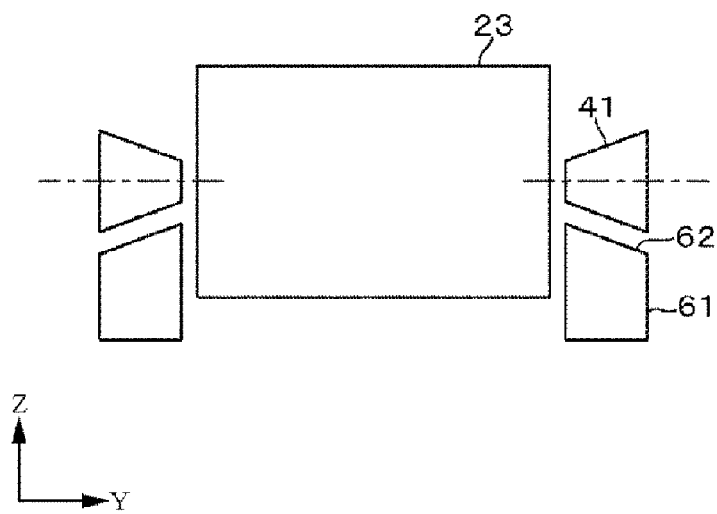
FIG. 23 is a front view showing another example of the opening/closing device.

FIG. 23 illustrates inclining the rotating surfaces of the rotating bodies 41 and the guideways 62 with respect to the horizontal plane. In FIG. 23, the rotating bodies 41 are formed such that the diameter thereof grows smaller as each of the rotating bodies 41 extends along the rotation axis from the outside (the side of the elevator rod 21) toward the inside (the side of the cover member 23). Each of the guideways 62 is formed to extend along the rotating surface of each of the rotating bodies 41 such that the height thereof grows larger as each of the guideways 62 extends from the outside toward the inside.

Figure 24:
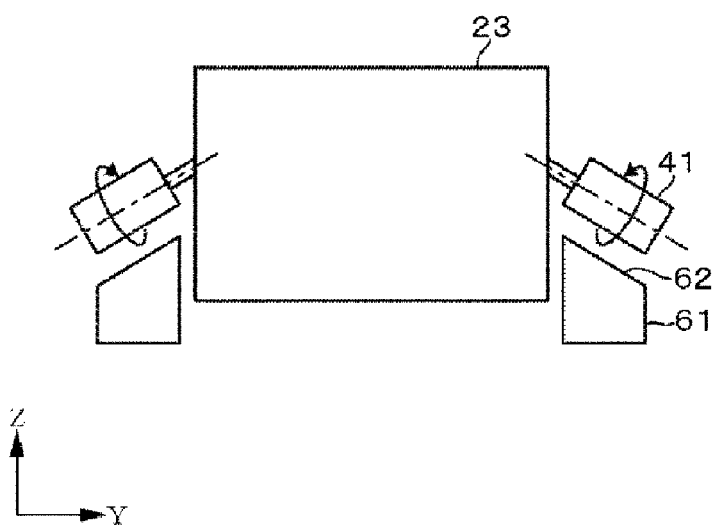
FIG. 24 is a front view showing another example of the opening/closing device.

FIG. 24 illustrates inclining the rotation axis of each of the rotating bodies 41 with respect to the horizontal direction. More specifically, each of the rotating bodies 41 is configured such that the height thereof becomes larger as each of the rotating bodies 41 extends from the outside toward the inside and such that each of the rotating bodies 41 rotates about the lateral axis (intersecting the extension axis of the elevator rod 21) parallel to the opening surface of the tubular body 5a. Each of the guideways 62 is formed to extend along the rotating surface of each of the rotating bodies 41 such that, as is the case in FIG. 23, the height thereof grows larger as each of the guideways 62 extends from the outside toward the inside. The rotating bodies 41 and the guide portions 61 are arranged at the left and right sides of the cover member 23. Thus the cover member 23 can move back and forth without dropping the rotating bodies 41 to the area outside the guideways 62.

Figure 25:
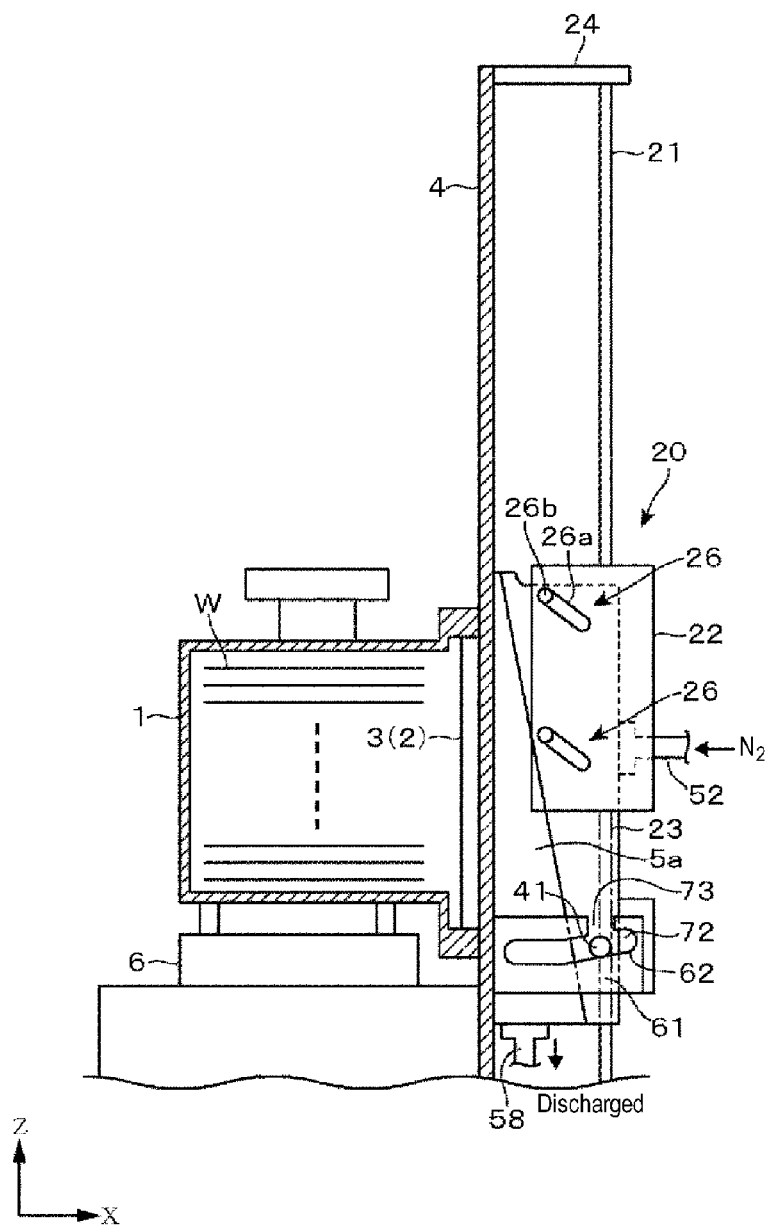
FIG. 25 is a side view showing another example of the opening/closing device.
Figure 26:
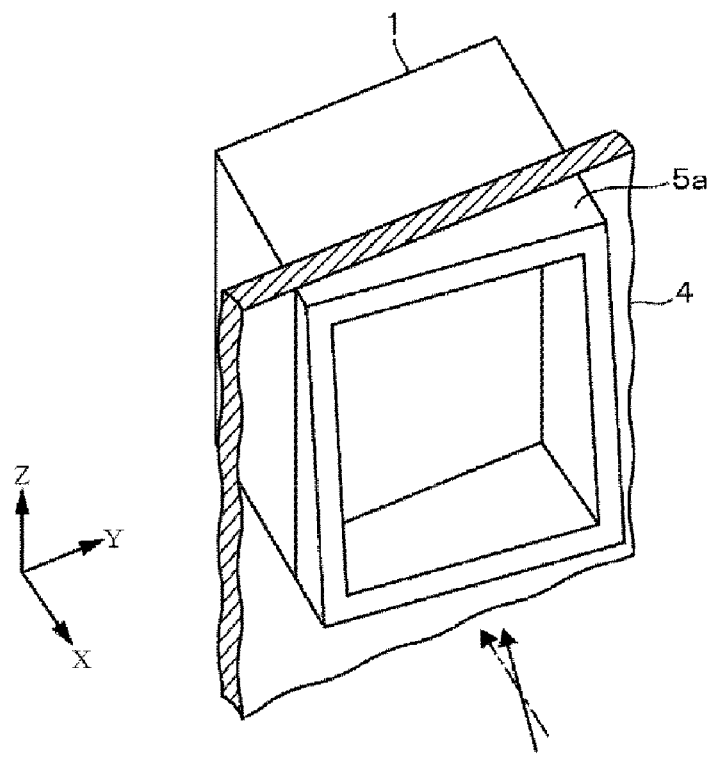
FIG. 26 is a perspective view showing another example of the opening/closing device.
Figure 27:
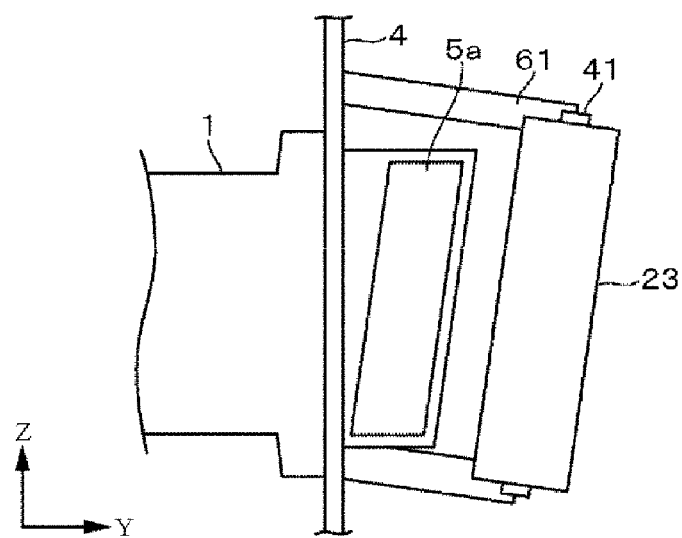
FIG. 27 is a side view showing another example of the opening/closing device.

FIG. 25 illustrates forming a guide slot 72 for guiding each of the rotating bodies 41 instead of the guide portion 61 as the slant guideway 62. In FIG. 25, a cutout 73 through which the rotating body 41 moves into and out of the guide slot 72 is formed above the guide slot 72. FIG. 26 illustrates forming the opening surface of the tubular body 5a to face obliquely upward and to face rightward when seen from the conveyance stage 7. As shown in FIG. 27, the rotating body 41 is configured to rotate about a horizontal axis extending along the opening surface of the tubular body 5a so that the cover member 23 can move perpendicularly with respect to the opening surface of the tubular body 5a. The guideway 62 of the guide portion 61 is formed orthogonal to the opening surface of the tubular body 5a so that the guideway 62 can guide the rotating body 41.

As described above, the elevator carriages 22 are configured to move in the up-down direction. Alternatively, the elevator carriages 22 may be configured to move in the left-right direction along the side wall 4. In this case, the opening surface of the tubular body 5a is formed to face toward one side in the moving direction of the elevator carriages 22 inclined with respect to the direction perpendicular to the side wall 4. The guide units 26, the rotating bodies 41 and the guide portion 61 are arranged so that the cover member 23 can move perpendicularly with respect to the opening surface of the tubular body 5a. More specifically, the guide units 26 are inclined from the other side to one side in the moving direction of the elevator carriages 22 as the guide units 26 extend from the inner side to the front side. The rotating body 41 is configured to rotate about an axis extending parallel to the opening surface of the tubular body 5a and intersecting the moving direction of the elevator carriages 22. The guide portions 61 are inclined from one side to the other side as the guide portions 61 extend from the inner side to the front side. The opening/closing device 20 of the present disclosure may be applied not only to the vertical heat treatment apparatus but also to other semiconductor manufacturing apparatuses, e.g., a coating/developing apparatus for forming a resist film on each of the wafers W and a probe apparatus for inspecting electrode pads by bringing probes into contact with the electrode pads formed on each of the wafers W. In this case, the opening/closing device 20 is arranged between the processing unit in which the wafers W are subjected to different kinds of processing (resist film formation and electrode pad inspection) and the support tables 6 on which the FOUP 1 is placed.

As described above, the cover member 23 is moved perpendicularly with respect to the seal member 56 when detaching and attaching the lid 3 of the FOUP 1. However, the present disclosure may be applied to other cases than the case where the lid 3 of the FOUP 1 is detached and detached. More specifically, the present disclosure may be applied to, e.g., a case where the lower opening end (throat) of the reaction tube 13 is hermetically closed by a cap. In this case, a seal member is provided around the opening end. The opening/closing device 20 is configured to horizontally hold and horizontally move the cap 13a for hermetically sealing the opening end. The present disclosure may be applied to an example in which a door (lid) for partitioning process chambers is opened and closed in a processing factory where a processed material such as a solid material is obtained by sequentially performing different kinds of processing (e.g., weighing, kneading, sintering and pulverizing) with respect to a material to be processed, e.g., powder.

In the present disclosure, the periphery of the opening of the opening existing at the side of the substrate transfer area is inclined upward with respect to a vertical plane in order to detach and attach (open and close) the lid of the substrate conveying container at the side of the substrate transfer area through the opening formed in the wall. The elevator carriage is configured to move up and down together with the cover member. The rotating body is provided in the cover member. The guideway is provided to guide the rotating body in such a way that, when the elevator carriage moves downward, the cover member can advance toward the opening in an opposing relationship with the opening. Accordingly, when the cover member is brought into contact with the seal member formed around the periphery of the opening of the opening by moving the elevator carriage up and down, it is possible to restrain the cover member from sliding with respect to the seal member. This makes it possible to reduce wear of the seal member.

While certain embodiments have been described, these embodiments have been presented by way of example only, and are not intended to limit the scope of the disclosures. Indeed, the novel devices and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures. Further, the various embodiments are not necessarily mutually exclusive as aspects of one embodiment can be combined with aspects of another embodiment.

What is claimed is:

1. A substrate conveying container opening/closing device for bringing a periphery of a lid openably closing a front surface of a substrate conveying container into contact with a periphery of a first opening formed at a first surface side of a wall, and for removing the lid through a second opening formed to be inclined upward with respect to a vertical plane and formed on a substrate transfer area which is at a second surface side of the wall, the device comprising:
an elevator carriage installed at the substrate transfer area, and configured to be moved up and down by an elevator mechanism;
a cover member configured to open and close the second opening, to be supported by the elevator carriage, and to be provided with a peripheral edge portion making contact with a periphery of the second opening to close the second opening;
a seal member configured to seal a gap between the cover member and the periphery of the second opening;
a lid detaching/attaching mechanism installed at the cover member, and configured to detach and attach the lid of the substrate conveying container while the second opening is closed by the cover member;
a guide unit installed at the elevator carriage, and configured to guide the cover member upward and to restrain a position of the cover member, in order for the cover member to advance from a retracting position toward the wall with respect to the elevator carriage;
a guideway installed at the wall to extend in a direction perpendicular to a seal surface of the periphery of the second opening; and
a rotating body installed at the cover member, and configured to be rotatable about a laterally-extending axis and parallel to an opening surface of the second opening, and configured to make contact with the guideway from above and to roll downward along the guideway as the elevator carriage is moved downward,
wherein the cover member is configured to lie in a retracting position when the elevator carriage is in an upper position, configured to advance from the retracting position by a rolling movement of the rotating body and the guiding action of the guide unit as the elevator carriage is moved downward, and configured to close the second opening in a posture opposing the second opening.

2. The device of claim 1, wherein the elevator carriage has a first support surface formed along a direction perpendicular to an advancing/retracting direction of the cover member with respect to the elevator carriage, and
wherein the cover member has a second support surface formed to face the first support surface, and includes a biasing mechanism installed between the first support surface and the second support surface opposing each other to bias the cover member away from the wall and toward the substrate transfer area.

3. The device of claim 2, further comprising:
a stopper mechanism composed of an elastic body, and installed between the first support surface and the second support surface opposing each other to restrain a collision between the elevator carriage and the cover member.

4. A substrate conveying container opening/closing device for bringing a periphery of a lid openably closing a front surface of a substrate conveying container into contact with a periphery of a first opening formed at a first surface side of a wall, and for removing the lid through a second opening formed to be inclined downward with respect to a vertical plane and formed on a substrate transfer area which is at a second surface side of the wall, the device comprising:
an elevator carriage installed at the substrate transfer area, and configured to be moved up and down by an elevator mechanism;
a cover member configured to open and close the second opening, to be supported by the elevator carriage, and to be provided with a peripheral edge portion making contact with a periphery of the second opening to close the second opening;
a seal member configured to seal a gap between the cover member and the periphery of the second opening;
a lid detaching/attaching mechanism installed at the cover member, and configured to detach and attach the lid of the substrate conveying container while the second opening is closed by the cover member;
a guide unit installed at the elevator carriage, and configured to guide the cover member downward, and to restrain a position of the cover member, in order for the cover member to advance from a retracting position toward the wall with respect to the elevator carriage;
a guideway installed at the wall to extend in a direction perpendicular to a seal surface of the periphery of the second opening;
a rotating body installed at the cover member, configured to be rotatable about a laterally-extending axis and parallel to an opening surface of the second opening, and configured to make contact with the guideway from below and to roll upward along the guideway as the elevator carriage is moved upward; and
the cover member configured to lie in a retracting position by a bias force of a biasing mechanism when the elevator carriage is in a lower position, configured to advance from the retracting position against the bias force of the biasing mechanism by a rolling movement of the rotating body and the guiding action of the guide unit as the elevator carriage is moved upward, and configured to close the second opening in a posture opposing the second opening,
wherein the biasing mechanism biases the cover member toward the substrate transfer area with respect to the elevator carriage.

5. A lid opening/closing device for opening and closing, from a second surface side of an opening communicating a first surface side and the second surface side of a wall, a lid of a substrate transfer container installed at the first surface side or a lid hermetically closing the opening from the second surface side, the device comprising:
a moving carriage installed at the second surface side of the wall, and configured to be moved by a moving mechanism between a first side and a second side of a shaft extending parallel along the wall;

a seal surface formed in a periphery of the opening at the second surface side, and configured to be inclined toward the first side of the shaft with respect to a direction perpendicular to the wall;

a cover member configured to open and close the opening, to be supported by the moving carriage, and to be provided with a peripheral edge portion making contact with the seal surface at the second surface side to close the opening;

a seal member configured to seal a gap between the cover member and the seal surface;

a lid detaching/attaching mechanism installed at the cover member, and configured to detach and attach the lid while the opening is closed by the cover member;

a guide unit installed at the moving carriage, and configured to guide the cover member along a direction between a direction perpendicular to the wall and a direction toward the first side, and to restrain a position of the cover member, in order for the cover member to advance from a retracting position toward the wall with respect to the moving carriage;

a guideway installed at the wall to extend in a direction perpendicular to the seal surface;

a rotating body installed at the cover member, configured to be rotatable about an axis intersecting the shaft and parallel to the seal surface, and configured to make contact with the guideway and to roll along the guideway as the moving carriage is moved toward the first side; and the cover member configured to lie in a retracting position when the moving carriage is in the first side position, to advance from the retracting position by a rolling movement of the rotating body and the guiding action of the guide unit as the moving carriage is moved toward the first side, and to close the opening in a posture opposing the seal surface, wherein a biasing mechanism biases the cover member toward the substrate transfer area with respect to the elevator carriage.

6. A semiconductor manufacturing apparatus, comprising:
a support table configured to place a substrate conveying container;
a processing unit configured to perform processing with respect to a substrate;
a substrate transfer mechanism configured to deliver the substrate between the substrate conveying container placed on the support table and the processing unit; and
the opening/closing device of claim 1 configured to open and close a lid of the substrate conveying container placed on the support table or a lid installed between the processing unit and the substrate transfer mechanism.

7. A semiconductor manufacturing apparatus, comprising:
a support table configured to place a substrate conveying container;
a processing unit configured to perform processing with respect to a substrate;
a substrate transfer mechanism configured to deliver the substrate between the substrate conveying container placed on the support table and the processing unit; and
the opening/closing device of claim 4 configured to open and close a lid of the substrate conveying container placed on the support table or a lid installed between the processing unit and the substrate transfer mechanism.

8. A semiconductor manufacturing apparatus, comprising:
a support table configured to place a substrate conveying container;
a processing unit configured to perform processing with respect to a substrate;
a substrate transfer mechanism configured to deliver the substrate between the substrate conveying container placed on the support table and the processing unit; and
the opening/closing device of claim 5 configured to open and close a lid of the substrate conveying container placed on the support table or a lid installed between the processing unit and the substrate transfer mechanism.

* * * * *